United States Patent
Takahashi et al.

(10) Patent No.: US 7,619,481 B2
(45) Date of Patent: Nov. 17, 2009

(54) CIRCUIT FOR INHIBITING OVER-CURRENT IN POWER AMPLIFIER

(75) Inventors: Hajime Takahashi, Gunma (JP); Hiroshi Ikeda, Saitama (JP)

(73) Assignee: Sanyo Electric Co., Ltd. (JP)

( * ) Notice: Subject to any disclaimer, the term of this patent is extended or adjusted under 35 U.S.C. 154(b) by 84 days.

(21) Appl. No.: 11/863,881

(22) Filed: Sep. 28, 2007

(65) Prior Publication Data
US 2009/0039963 A1 Feb. 12, 2009

Related U.S. Application Data

(60) Provisional application No. 60/954,643, filed on Aug. 8, 2007.

(51) Int. Cl.
*H03F 1/52* (2006.01)

(52) U.S. Cl. .................................. 330/298; 330/207 P

(58) Field of Classification Search .............. 330/207 P, 330/298; 455/117
See application file for complete search history.

(56) References Cited

U.S. PATENT DOCUMENTS 5,973,569 A * 10/1999 Nguyen ...................... 330/298
2008/0048784 A1 * 2/2008 Shih ........................... 330/298

* cited by examiner

*Primary Examiner*—Khanh V Nguyen
(74) *Attorney, Agent, or Firm*—Cantor Colburn LLP

(57) ABSTRACT

A power amplifier drives a load connected to a first output terminal and a second output terminal. When generation of over-current is detected by the current detection section, the output amplifier control section is controlled to stop the operation of the output amplifier section, and when a voltage greater than or equal to said set value is detected by said voltage detection section, the stopped operation of said output amplifier section is maintained even though generation of the over-current is not detected at the current detection section. When the terminal voltage detection section detects a terminal voltage greater than or equal to a predetermined voltage, over-current at the current detection section is suppressed.

10 Claims, 2 Drawing Sheets

CIRCUIT FOR INHIBITING OVER-CURRENT IN POWER AMPLIFIER

CROSS REFERENCE TO RELATED APPLICATION

This application claims priority to U.S. Provisional Application 60/954,643, filed Aug. 8, 2007, the disclosure of which is incorporated herein by reference.

BACKGROUND OF THE INVENTION

1. Field of the Invention

The present invention relates to inhibiting over-current in a power amplifier driving a load in a BTL configuration.

2. Description of the Related Art

In an audio power amplifier for STL operation, a load, such as a speaker, is connected to bridge between two output terminals (+OUT, −OUT). Each output amplifier respectively connected to each output terminal outputs a signal having an opposite phase to each other with respect to the load to drive the load. In this power amplifier, if the two output terminals +OUT and −OUT are inadvertently connected (shorted) to a high voltage supply Vcc or a low voltage supply (ground or GND), a particularly large current flows to a power transistor in the output amplifier section causing failure. Thus, heretofore, detecting currents higher than a predetermined amount flowing to the power amplifier and controlling the operation of the amplifier were performed.

FIG. 1 shows a configuration of over-current prevention of the related art in a BTL-type audio power amplifier. One of two output amplifier sections in the power amplifier driving a load L in a BTL configuration has a first source-side output transistor (upper power transistor) PQ1 and a third sink-side output transistor (lower power transistor) PQ3 provided between the supply Vcc and the ground GND. Similarly, the other output amplifier section has a second source-side output transistor PQ2 and a fourth sink-side output transistor PQ4 provided between Vcc and GND. The load L is then connected in a STL configuration between the +OUT and −OUT output terminals respectively connected to the two output amplifier sections.

A first over-current detector 10 is provided between the base of the source-side output transistor PQ1 and a current detector 500 for supplying detection current to the current detector 500 in accordance with the current flowing through the output transistor PQ1. Similarly, a third over-current detector 30 is provided between the base of the sink-side output transistor PQ3 and the current detector 500 for supplying detection current to the current detector 500 in accordance with the current flowing through the output transistor PQ3. A second over-current detector 20, having the same configuration as the first over-current detector 10 shown in FIG. 1, supplies detection current to the current detector 500 (not shown in FIG. 1) in accordance with the current flowing through the output transistor PQ2, and a fourth over-current detector 40, having the same configuration as the third over-current detector 30 shown in FIG. 1, supplies detection current to the current detector 500 in accordance with the current flowing through the output transistor PQ4.

For example, at the output transistor PQ1, if a short circuit occurs between the +OUT output terminal and GND, an over-current (short-circuit current referred to hereinafter as short-circuit current Iout2) greater than or equal to a predetermined current value Iout2 flows via the output transistor PQ1 from the supply Vcc from the shorted +OUT output terminal to GND as shown by the dashed line in FIG. 1 during operation of the power amplifier. The first over-current detector 10 outputs a detection current in accordance with the short-circuit current Iout2 to the current detector 500.

More specifically, first, the source-side output transistor PQ1 turns on and the short-circuit current Iout2 flows so that the base voltage of the PNP-type source-side output transistor PQ1 drops below Vcc by the amount of an emitter-base voltage VBE. Divider resistors R1 and R2 are connected between the base of the source-side output transistor PQ1 and the supply Vcc. In accordance with the drop in base voltage of the source-side output transistor PQ1, the voltage at node n1 between the divider resistors R1 and R2 drops.

The base of a PNP-type transistor Q1 is connected to the node n1. When the voltage of the node n1 drops and the base-emitter voltage of the transistor Q1 becomes greater than an operating threshold of the transistor Q1, the transistor Q1 turns on. When the transistor Q1 turns on, a current flows from the supply Vcc to the base and emitter of a transistor Q2, via a resistor R5 and the emitter and collector of the transistor Q1, and the transistor Q2 turns on.

The NPN transistor Q2 and an NPN transistor Q6 form a current-mirror circuit. A current Iq6, which is equivalent to a current Iq2 flowing to the transistor Q2, flows to the transistor Q6. The base and collector of a transistor Q5 and the base of a transistor Q9 are connected to the collector of the transistor Q6. The transistors Q5 and Q9 are PNP transistors, their emitters are both connected to the supply Vcc, and the transistors Q5 and Q9 form a current-mirror circuit.

When the transistor Q5 operates and current Iq5 corresponding to the current flowing to the transistor Q6 flows to the transistor Q5, a current Iq9, which is equivalent to the current Iq5, flows to the transistor Q9 and is supplied to the current detector 500 as detection current in accordance with the short-circuit current Iout2

On the other hand, for example, at the output transistor PQ1, if a short circuit occurs between the +OUT output terminal and Vcc, an over-current (short-circuit current referred to hereinafter as short-circuit current Iout1) greater than or equal to a predetermined current value Iout1 flows from the supply Vcc via the output transistor PQ3 to GND as shown by the dotted line in FIG. 1 during operation of the power amplifier. The third over-current detector 30 outputs a detection current in accordance with the short-circuit current Iout1 to the current detector 500.

More specifically, when the sink-side output transistor PQ3 turn on and the short-circuit current Iout1 flows, the base voltage of the NPN sink-side output transistor PQ3 rises according to the short-circuit current Iout1. Divider resistors R3 and R4 are connected between the base of the power transistor PQ3 and GND (ground potential). The base of a NPN transistor Q4 is connected to a node n2 between the divider resistors R3 and R4. Thus, when the power transistor PQ3 turns on, the voltage at node n2 rises, and the base-emitter voltage of the NPN transistor Q4 becomes greater than an operating threshold of the transistor Q4, the transistor Q4 turns on.

The emitter of the transistor Q4 is connected to GND via a resistor R6 and the collector is connected to the base and collector of the transistor Q3. Furthermore, the above-mentioned PNP-type transistor Q3 and a PNP-type transistor Q7, the emitters of which are connected to a common line from the +OUT output terminal, form a current-mirror circuit. Therefore, when the transistor Q4 turns on and accordingly the transistor Q3 turns on, and a current Iq3, which corresponds to the current caused to flow by the transistor Q4 toward GND, flows to the transistor Q3, a current Iq7, which is equivalent to the current Iq3, flows to the transistor Q7. The current Iq7 is supplied to the current detector 500 as a detection current in accordance with the short-circuit current Iout1 via a PNP-type transistor Q8, which is connected as a diode for reverse current prevention.

Similar to the first over-current detector 10 as described above, the second over-current detector 20 is provided between the base of the PNP-type source-side output transistor PQ2 and the current detector 500. If the short-circuit current Iout1 flows to the source-side output transistor PQ2, the second over-current detector 20 operates in the same manner as the first over-current detector 10 and a detection current in accordance with the short-circuit current Iout1 is supplied to the current detector 500.

Furthermore, similar to the third over-current detector 30 as described above, the fourth over-current detector 40 is provided between the base of the NPN sink-side output transistor PQ4 and the current detector 500. If the short-circuit current Iout2 flows to the sink-side output transistor PQ4, the fourth over-current detector 40 operates in the same manner as the third over-current detector 30 and a detection current in accordance with the short-circuit current Iout2 is supplied to the current detector 500.

If even one of the detection currents supplied to the short-circuit current detectors 10, 20, 30, and 40 is greater than or equal to a predetermined value, the current detector 500 generates an over-current detection signal I1 and supplies the signal to a controller 300. When the over-current detection signal I1 is supplied, the controller 300 operates an amplifier control transistor Q10, stops the operation of an output amplifier bias section 400 to stop the signal output from the output transistors PQ1-PQ4, and prevents the over-current from flowing to the output transistors.

In the configuration for over-current prevention in FIG. 1, in comparison to the voltage at the +OUT and −OUT output terminals of the amplifier is approximately Vcc/2 during normal operation, a voltage higher than Vcc/2 is generated when a short circuit occurs between the supply Vcc or GND and either the +OUT or −OUT output terminal as described above. Heretofore, to reliably prevent the generation of over-current, a voltage detector 200 is provided in addition to the above-mentioned current detector 500 in the power amplifier to detect the terminal voltages at the ROUT and −OUT output terminals.

The voltage detector 200 outputs an over-voltage detection signal I2 to the controller 300 when the terminal voltage is greater than or equal to a predetermined value. When the over-current detection signal I1 is output from the current detector 500 and the over-voltage detection signal I2 is supplied from the above-mentioned voltage detector 200, the controller 300 operates the amplifier control transistor Q10 and continues control of the amplifier (latches up the amplifier stop instruction), such as stopping its operation.

Due to the above-mentioned over-current prevention configuration, if a short circuit occurs between the supply terminals or between the supply and the amplifier output, the amplifier output voltage is higher than a normal value of Vcc/2 so that the power amplifier can be reliably protected from over-currents provided the operation of the power amplifier is kept stopped.

However, if a short circuit occurs between the +OUT and −OUT output terminals, over-currents Iout1 and Iout2 flow to the output transistors PQ1-PQ4 and the terminal maintains a voltage of approximately Vcc/2, which is similar to that during normal operation. For this reason, the over-current detection signal I1 is output from the current detector 500 although the over-voltage detection signal I2 is not output from the voltage detector 200. Therefore, when the over-current detection signal I1 is output and the power amplifier initially stops, the generation of over-current is then not detected and the generation of over-current detection signal I1 is terminated. For this reason, the operation of the power amplifier resumes and over-current again flows to the power amplifier.

When over-current flows intermittently to the power amplifier in this manner, this leads to deterioration of the output transistors PQ1-PQ4. Therefore, in such an instance, a set value (threshold) for determining the generation of over-current, for example, a set current value (current threshold) at the current detector 500, can be lowered. However, since the sound may become intermittent if the current detector 500 operates during normal operation and the power amplifier stops, a limitation is that the set current value cannot be set lower than a current value corresponding to a maximum current value Icmax that flows to a load L during normal operation. Therefore, lowering the set current when intermittent over-current is generated to prevent the deterioration of the output transistors PQ1-PQ4 is inadequate.

SUMMARY OF THE INVENTION

It is therefore an object of the present invention to reliably suppress over-current at the power amplifier without influencing normal operation.

The present invention is a power amplifier for driving a load connected between an first output terminal and a second output terminal, having a first output amplifier section for outputting a predetermined signal to the load from the first output terminal and a second output amplifier section for outputting a signal, having an opposite phase to the signal from the first output amplifier section, from the second output terminal, an output amplifier control section for controlling operation of the first output amplifier section and the second output amplifier section, a current detection section for detecting that a current flowing to at least either the first output amplifier section or the second output amplifier section is an over-current greater than or equal to a set value, a voltage detection section for detecting that a voltage at the first output terminal and the second output terminal is greater than or equal to a set value, a control section for stopping the operation of the output amplifier section by controlling the output amplifier control section when generation of the over-current is detected by the current detection section and for maintaining the stopped operation of the output amplifier section even though generation of the over-current is not detected at the current detection section when a voltage greater than or equal to the set value is detected by the voltage detection section, and a terminal voltage detection section for detecting that terminal voltage between the first output terminal and the second output terminal is greater than or equal to a set value. The detection sensitivity of generation of the over-current is lowered at the current detection section when a terminal voltage greater than or equal to the set value is detected by the terminal voltage detection section.

Another aspect of the present invention is a power amplifier for driving a load connected between a first output terminal and a second output terminal, having a first output amplifier section for outputting a predetermined signal to the load from the first output terminal and a second output amplifier section for outputting a signal, having an opposite phase to the signal from the first output amplifier section, from the second output terminal, an output amplifier control section for controlling operation of the first output amplifier section and the second output amplifier section, a current detection section for detecting that a current flowing to at least either the first output amplifier section or the second output amplifier section is an over-current greater than or equal to a set value, a voltage detection section for detecting that a voltage at the first output terminal and the second output terminal is greater than or equal to a set value, a control section for stopping the operation of the output amplifier section by controlling the output amplifier control section when generation of the over-current is detected by the current detection section and for maintaining the stopped operation of the output amplifier section even though generation of the over-current is not detected at the current detection section when a voltage greater than or equal to said set value is detected by the voltage detection section, and a terminal voltage detection section for detecting that terminal voltage between the first output terminal and the second output terminal is greater than or equal to a set value. The operation to detect generation of the over-current is stopped at the current detection section when a terminal voltage greater than or equal to the set value is detected by the terminal voltage detection section.

Another aspect of the present invention is the above-mentioned power amplifier wherein the switching device has a transistor in a diode configuration with base and collector short circuited. When the terminal voltage exceeds a voltage corresponding to an operating threshold of the transistor, a current corresponding to a current flowing as the transistor operates is subtracted from the detection current supplied to the current detection section.

Another aspect of the present invention is the above-mentioned power amplifier wherein the first output amplifier section and the second output amplifier section respectively has a source-side output transistor and a sink-side output transistor connected between a high voltage supply and a low voltage supply. The current detection section detects the generation of the over-current at the source-side output transistor and the sink-side output transistor from detection current on the basis of base voltage at each transistor in accordance with respective current flowing to the source-side output transistor and the sink-side output transistor.

Since the power amplifier in the present invention drives a load in a BTL configuration using signals from two outputs, the terminal voltage usually has a certain degree of magnitude during normal operation. Therefore, if the terminal voltage is greater than a predetermined value, a short circuit between the terminals can be judged not to have occurred. By lowering (stopping) the generation sensitivity of the over-current, the incorrect judgment of over-current generation during normal operation and the stopping of the amplifier operation are prevented. Furthermore, since malfunctions during normal operation can be prevented, it becomes possible to set a low over-current detection threshold for detection current supplied to the current detection section and to set a high over-current detection sensitivity not only when there is an incorrect connection between the supply terminals or between a supply terminal and an output terminal but also when there is an incorrect connection between terminals.

DETAILED DESCRIPTION OF THE PREFERRED EMBODIMENTS

Hereinafter, preferred embodiments of the present invention will be described with reference to the attached drawings.

Figure 2:
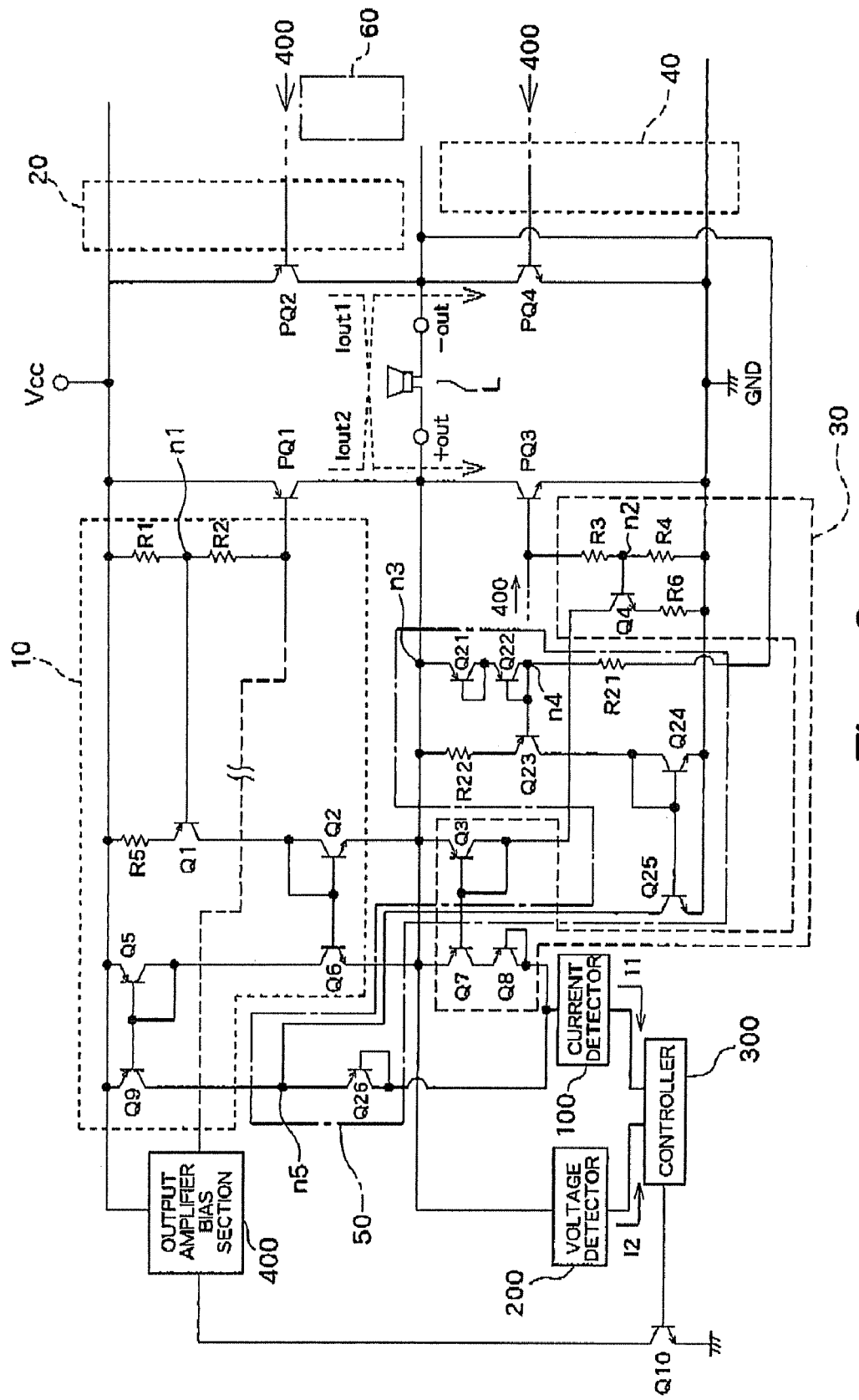
FIG. 2 shows an over-current prevention configuration of the power amplifier relating via embodiment of the present invention.

FIG. 2 shows the over-current prevention configuration of the power amplifier relating to the embodiment of the present invention.

The power amplifier relating to the embodiment, such as a BTL operating mode power amplifier, has signals having mutually-opposite phases output from +OUT and −OUT output terminals connected respectively to two output amplifier sections to drive a load L connected between the terminals in a BLT configuration.

Furthermore, a first output amplifier section includes the source-side output transistor PQ1 and the sink-side output transistor PQ3, which are connected between the supply Vcc and GND, and similarly, a second output amplifier section includes the source-side output transistor PQ2 and the sink-side output transistor PQ4, which are connected between the supply Vcc and GND. The output amplifier control section (output amplifier bias section) 400 controls the operation of the output transistors PQ1-PQ4 in the above-mentioned first output amplifier section and second output amplifier section.

Between each base of the output transistors PQ1-PQ4 and the current detector 100 is the corresponding over-current detector 10, 20, 30, or 40. The current detector 100 detects whether or not each current flowing to the output transistors PQ1-PQ4 is an over-current greater than or equal to a predetermined value on the basis of the detection current that is supplied from the over-current detectors 10, 20, 30, and 40.

Figure 1:
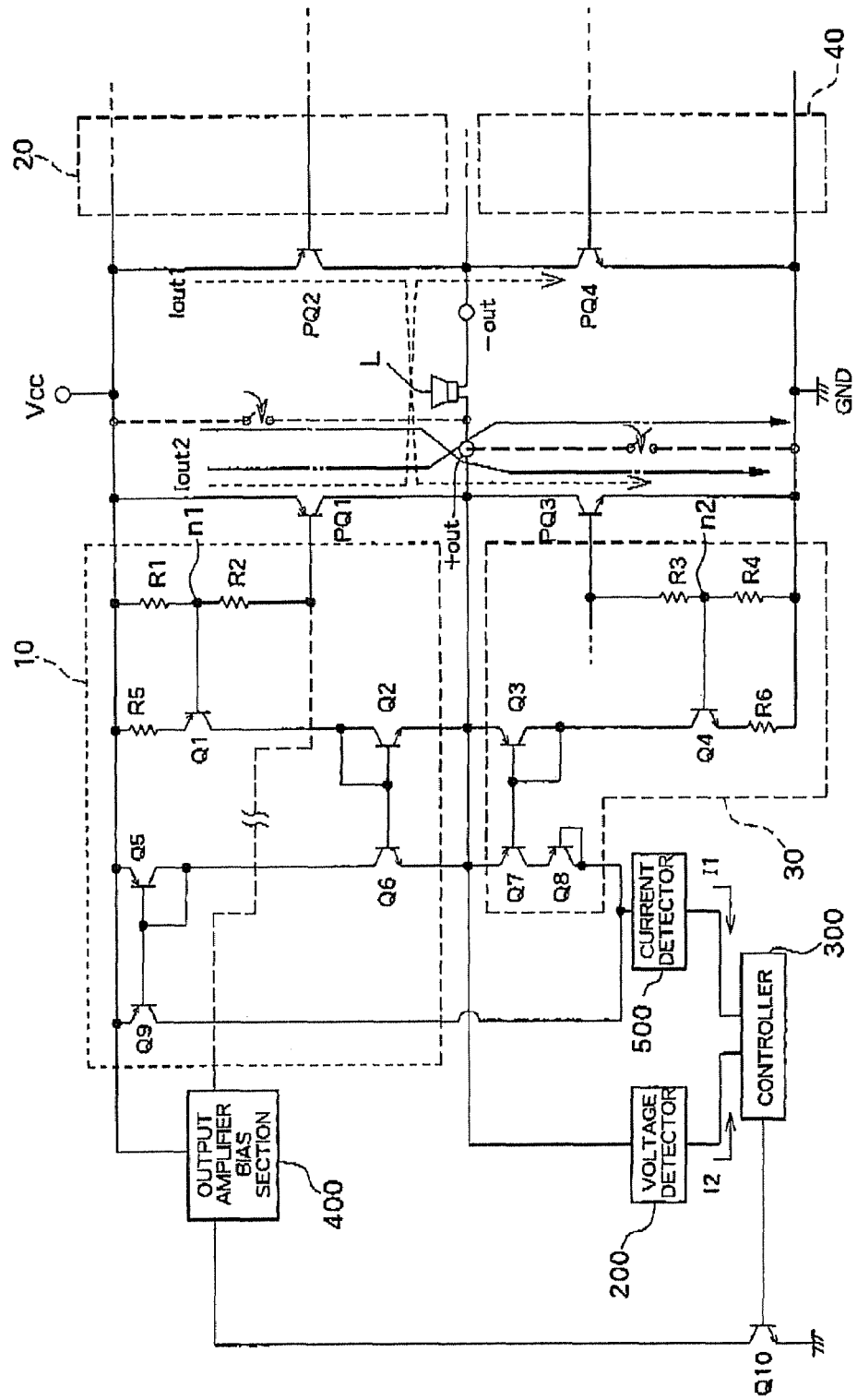
FIG. 1 shows an over-current prevention configuration in the power amplifier of the related art.

The over-current detectors 10, 20, 30, and 40 have a common configuration and operation with the detectors 10, 20, 30, and 40 of FIG. 1. The detection current in accordance with the currents Iout2 and Iout1 flowing to the source-side output transistors PQ1 and PQ3 is supplied to the current detector 100 from the over-current detectors 10 and 20. More specifically, the transistors Q1, Q2, Q6 and Q9 of the over-current detectors 10 and 20 operate on the basis of the voltages at the bases of the transistors PQ1 and PQ2 generated in accordance with the currents Iout2 and Iout1, and the current that is caused to flow by the transistor Q9 is supplied as the detection current to the current detector 100. Furthermore, the detection currents in accordance with the currents Iout1 and Iout2 flowing to the sink-side output transistors PQ3 and PQ4 are supplied from the over-current detectors 30 and 40 to the current detector 100. More specifically, the transistors Q4, Q3, Q7, and Q8 operate on the basis of the base voltages of the transistors PQ3 and PQ4 generated in accordance with the currents Iout1 and Iout2, and the current that is caused to flow by the transistor Q7 is supplied as the detection current to the current detector 100 via the transistor Q8.

The current detector 100 generates the over-current detection signal I1 when the detection current supplied from any of the over-current detectors 10, 20, 30, or 40 is greater than the current value set as a threshold and outputs the signal to the controller 300.

The voltage detector 200 also has the same configuration as that shown in FIG. 1 where the voltage detector 200 is connected to the +OUT and −OUT output terminals and outputs the over-voltage detection signal I2 to the controller 300 when the output terminals reach a voltage exceeding a predetermined amount over Vcc/2.

The power amplifier relating to the embodiment further includes a terminal voltage detector 50. The terminal voltage detector 50 detects the voltage across the two +OUT and −OUT output terminals. If the voltage is greater than or equal to a set value, the operation is judged to be normal and the detection of over-current generation in the current detector 100 is suppressed. In other words, the over-current detection sensitivity in the current detector 100 is changed (lowered). More specifically, the sensitivity adjustment is automatically executed by adjusting the detection currents supplied from the over-current detectors 10, 20, 30, and 40 to the current detector 100 in accordance with the detection signal from the above-mentioned terminal voltage detector 50.

Hereinafter, the terminal voltage detector 50 will be described. As an example, the terminal voltage detector 50 is configured by the circuit elements shown in FIG. 2 and includes transistors Q21-Q26 and resistors R21 and R22. A switch device for operating in accordance with the terminal voltage and the resistor R21 are provided between the +OUT and −OUT output terminals. The switch device is connected to a node n3, which is connected to the +OUT output terminal, and to a node n4, which is connected to the −OUT output terminal via the resistor R21, and includes the transistors Q21 and Q22, which are configured as diodes with a short-circuit between base and collector. The transistors Q21 and Q21 are PNP-type transistors and employ bipolar transistors similar to the other transistors shown. The anode of the diode-configured transistor Q21 is connected to the node n3 side and the cathode of the diode-configured transistor Q22 is connected to the node n4 side. Thus, when the voltage at the node n3 is higher than the voltage at the node n4 by at least a BE summed value ($2V_{BE} \approx 1.4V$) of the operating threshold voltage ($V_{BE} \approx$ approximately 0.7V) of the transistors Q21 and Q22, the transistors Q21 and Q22 turn on and current flows from the node n3 toward the BE node n4.

The PNP-type transistor Q23 has its base connected to the short-circuited base and collector of the above-mentioned transistor Q22 and the transistors Q22 and Q23 form a current mirror circuit. For this reason, when the voltage at the +OUT output terminal is higher than the voltage at the −OUT side by at least $2V_{BE}$ and the transistors Q21 and Q22 turn on, a current equivalent to the current flowing to the transistor Q22 flows to the transistor Q23 from the +OUT output terminal via the resistor R22.

Furthermore, the collector of the above-mentioned transistor Q23 is connected to the short-circuited base and collector of the NPN transistor Q24. Moreover, the transistor Q24 and the NPN transistor Q24, which has its emitter connected to GND, form a current mirror circuit. Therefore, when the above-mentioned transistor Q23 turns on, a current Iq24 flows to the transistor Q24 in accordance with the current flowing to the transistor Q23 and a current, which is equivalent to the current Iq24, flows to the transistor Q25. As shown in FIG. 2, the collector of the transistor Q25 is connected to a node n5 between the transistor Q9, which is a final output transistor of the over-current detector 10 for the source-side output transistor PQ1, and the current detector 100. The PNP-type transistor Q26 configured as a diode with a short circuit between base and collector is provided between the node n5 and the current detector 100. Therefore, when the potential difference between the node n3 and the node n4 is greater than or equal to $2V_{BE}$, the transistors Q21 and Q22 operate, and current flows from the node n3 to the node n4, a corresponding current ultimately is drawn from the node n5 to GND via the transistor Q25. The above-mentioned transistor Q26 functions as a reverse current prevention diode when the transistors Q7 and Q8 are on so that the transistor Q25 does not conduct current that is caused to flow by the transistors Q7 and Q8.

Namely, when the terminal voltage at the terminal voltage detector 50 reaches a set value or higher, a current corresponding to the current flowing through the switch device (Q21, Q22) is subtracted from the detection current that is output from the transistor Q9 in accordance with the current flowing to the output transistor PQ1 and the resulting detection current after subtraction is supplied to the current detector 100.

Although not shown in FIG. 2, a terminal voltage detector 60 having the same configuration as the above-mentioned terminal voltage detector 50 is provided between the over-current detector 20 and the current detector 100. The terminal voltage detector 60 detects whether the −OUT output terminal is higher than the +OUT output terminal by a predetermined voltage of $2V_{BE}$ or more. If the terminal voltage is greater than or equal to a predetermined value, a current corresponding to the current flowing through the switch device in accordance with the BE terminal voltage is subtracted from the detection current that is supplied to the current detector 100 from the over-current detector 20.

As described above in the power amplifier of the embodiment, the output amplifier sections are driven by the output amplifier controller 400 so that signals having mutually opposite phases are output from the two output terminals +OUT and −OUT to drive the load in the BLT configuration. Thus, if the terminals are not short circuited, the terminal voltage does not become 0V during normal amplifier operation and is, for example, approximately the above-mentioned 2V. Therefore, normal operation can be judged from the detection of whether or not the terminal voltage is greater than or equal to a predetermined value by the terminal voltage detector 50. Furthermore, during normal operation, by minimizing the value of the detection current that is supplied to the current detector 100 from the over-current detector 10 in accordance with the current that flows to the output transistor PQ1, the above-mentioned detection current can be prevented from exceeding a current threshold that has been set in advance in the current detector 100. Namely, since the generation of the over-current detection signal I1 is suppressed at the current detector 100 during normal operation, the threshold for over-current detection at the current detector 100 can be set to a lower value than the maximum current Icmax that flows to the load during normal operation.

If the terminals are short circuited, the over-voltage detection signal I2 is output from the voltage detector 200 since the detection voltage at the voltage detector 200 is approximately vcc/2 as described above so that the operation of the output amplifier sections has a low probability of being continuously stopped. However, since the current threshold at the current detector 100 can be set to a low value as described above, when a current greater than or equal to a predetermined value and smaller than the above-mentioned maximum current Icmax flows at one of the output transistors PQ1-PQ4, the over-current detection signal I1 is immediately generated in response and the operation of the output amplifier sections can be stopped. Therefore, if the terminals are short circuited, the output amplifier sections operate intermittently. However, the current amounts, which the output transistors PQ1-PQ4 of the output amplifier sections cause to flow, can be set low and the number of times the current flows can be reduced so that failure of the power amplifier caused by the intermittent flow of over-currents can be reliably prevented.

Among the source-side output transistors PQ1 and PQ2 and the sink-side output transistors PQ3 and PQ4, the current signal in accordance with the terminal voltage detected by the terminal voltage detectors 50 and 60 controls the output currents of the detectors 10 and 20 for over-current detection at the source-side output transistors FQ1 and PQ2 and do not control the output currents of the detectors 30 and 40 for the sink-side output transistors PQ3 and PQ4. Although control for the output currents of the detectors 30 and 40 for the sink-side output transistors PQ3 and PQ4 may be executed, the detectors 10 and 20 for the source-side transistors PQ1 and PQ2 are controlled in the embodiment as described above.

In the current detector 100, the thresholds for the detection currents from the source-side detectors 10 and 20 and the detection currents from the sink-side detectors 30 and 40 can be respectively set for the source side and the sink side. As an example, a setting can be made where the currents flowing to the source-side output transistors PQ1 and PQ2 are detected as over-currents for the source side when they are "1" while the currents flowing to the sink-side output transistors PQ3 and PQ4 are detected as over-currents for the sink side when they are "2". For example, if NPN transistors are employed for the sink-side output transistors PQ3 and PQ4 and vertical (V) PNP transistors are employed for the source-side output transistors PQ1 and PQ2, the ASO (Area of Safety Operation) of the source-side output transistors PQ1 and PQ2 through which over-current flows when GND and the +OUT and −OUT output terminals are short circuited is narrower than the ASO of the sink-side output transistors PQ3 and PQ4 through which over-current flows when Vcc and the +OUT and −OUT output terminals are short circuited so that the sensitivity of the over-current detection at the source side is higher, namely, the protection circuit for over-current suppression is easily operated. In this case, the over-current detection signal I1 from the current detector 100 is generated at a smaller detection current from the detectors 10 and 20 than from the circuits 30 and 40. Thus, if the output currents of the detectors 10 and 20 at the source side are controlled by the terminal voltage detectors 50 and 60, functions to suppress over-currents and prevent intermittent over-current generation can be implemented with minimal circuit components, which is effective in reducing chip area.

If the load is driven in a BTL configuration and short circuited, the over-current flows in the path of PQ1 to PQ4 or the path of PQ2 to PQ3 so that being able to detect whether the over-current flows in the source side or the sink side is sufficient. Therefore, only the output currents of the detectors 10 and 20 on the source side in the embodiment are controlled. If there is room for expansion in the employed number of circuits and chip area, control may be performed on the basis of the detected result of the terminal voltage detectors 50 and 60 for the detectors 10, 20, 30, and 40 on the source side and sink side.

While there has been described what are at present considered to be preferred embodiments of the invention, it will be understood that various modifications may be made thereto, and it is intended that the appended claims cover all such modifications as fall within the true spirit and scope of the intention.

What is claimed is:

1. A power amplifier for driving a load connected between an first output terminal and a second output terminal, comprising:
    a first output amplifier section for outputting a predetermined signal to said load from said first output terminal and a second output amplifier section for outputting a signal, having an opposite phase to the predetermined signal from said first output amplifier section, from said second output terminal;
    an output amplifier control section for controlling operation of said first output amplifier section and said second output amplifier section;
    a current detection section for detecting overcurrent flowing to at least either said first output amplifier section or said second output amplifier section is greater than or equal to a set value;
    a voltage detection section for detecting a voltage at said first output terminal and said second output terminal is greater than or equal to a set value;
    a control section for stopping the operation of said first and second output amplifier section by controlling said output amplifier control section when generation of said over-current is detected by said current detection section and for maintaining the stopped operation of said first and second output amplifier section even though generation of said over-current is not detected at said current detection section when a voltage greater than or equal to said set value is detected by said voltage detection section; and
    a terminal voltage detection section for detecting terminal voltage between said first output terminal and said second output terminal is greater than or equal to a set value;
    detection sensitivity of generation of said over-current is lowered at said current detection section when a terminal voltage greater than or equal to said set value is detected by said terminal voltage detection section.

2. A power amplifier according to claim 1, wherein:
    said current detection section detects the generation of said over-current on the basis of detection current supplied to said current detection section in accordance with current flowing to either said first output amplifier section or said second output amplifier section; and
    when said terminal voltage detection section detects said terminal voltage greater than or equal to set value, said detection current is lowered.

3. A power amplifier according to claim 1, wherein:
    said terminal voltage detection section comprises a switching device for operating in accordance with said terminal voltage between said first output terminal and said second output terminal;
    a current flowing to said terminal voltage detection section as said switching device operates is subtracted from said detection current supplied to said current detection section.

4. A power amplifier according to claim 3, wherein:
    said switching device comprises a transistor in a diode configuration with base and collector short circuited;
    when said terminal voltage exceeds a voltage corresponding to an operating threshold of said transistor, a current corresponding to a current flowing as said transistor operates is subtracted from said detection current supplied to said current detection section.

5. A power amplifier according to claim 1, wherein:
    said first output amplifier section and said second output amplifier section respectively comprises a source-side output transistor and a sink-side output transistor connected between a high voltage supply and a low voltage supply;
    said current detection section detects the generation of said over-current at said source-side output transistor and said sink-side output transistor on the basis of base voltage at each transistor in accordance with respective current flowing to said source-side output transistor and said sink-side output transistor.

6. A power amplifier for driving a load connected between a first output terminal and a second output terminal, comprising:
    a first output amplifier section for outputting a predetermined signal to said load from said first output terminal and a second output amplifier section for outputting a signal, having an opposite phase to the predetermined signal from said first output amplifier section, from said second output terminal;

an output amplifier control section for controlling operation of said first output amplifier section and said second output amplifier section;

a current detection section for detecting an overcurrent flowing to at least either said first output amplifier section or said second output amplifier section is greater than or equal to a set value;

a voltage detection section for detecting a voltage at said first output terminal and said second output terminal is greater than or equal to a set value;

a control section for stopping the operation of said first and second output amplifier section by controlling said output amplifier control section when generation of said over-current is detected by said current detection section and for maintaining the stopped operation of said first and second output amplifier section even though generation of said over-current is not detected at said current detection section when a voltage greater than or equal to said set value is detected by said voltage detection section; and a terminal voltage detection section for detecting terminal voltage between said first output terminal and said second output terminal is greater than or equal to a set value;

operation to detect generation of said over-current is stopped at said current detection section when a terminal voltage greater than or equal to said set value is detected by said terminal voltage detection section.

7. A power amplifier according to claim 6, wherein:

said current detection section detects the generation of said over-current on the basis of detection current supplied to said current detection section in accordance with current flowing to either said first output amplifier section or said second output amplifier section; and when said terminal voltage detection section detects said terminal voltage greater than or equal to a set value, said detection current is lowered and the detection of generation of said over-current at said current detection section is stopped.

8. A power amplifier according to claim 6, wherein:

said terminal voltage detection section comprises a switching device for operating in accordance with said terminal voltage between said first output terminal and said second output terminal;

a current flowing to said terminal voltage detection section as said switching device operates is subtracted from said detection current supplied to said current detection section.

9. A power amplifier according to claim 8, wherein:

said switching device comprises a transistor in a diode configuration with base and collector short circuited;

when said terminal voltage exceeds a voltage corresponding to an operating threshold of said transistor, a current corresponding to a current flowing as said transistor operates is subtracted from said detection current supplied to said current detection section.

10. A power amplifier according to claim 6, wherein:

said first output amplifier section and said second output amplifier section respectively comprises a source-side output transistor and a sink-side output transistor connected between a high voltage supply and a low voltage supply;

said current detection section detects the generation of said over-current at said source-side output transistor and said sink-side output transistor on the basis of base voltage at each transistor in accordance with respective current flowing to said source-side output transistor and said sink-side output transistor.

* * * * *